United States Patent
Szekeresch et al.

(10) Patent No.: US 12,023,906 B2
(45) Date of Patent: Jul. 2, 2024

(54) PRINTING MACHINE AND PRINTING SYSTEM HAVING SCREEN MAGAZINE FOR PRINTING ON PLANAR SUBSTRATES

(71) Applicant: EKRA AUTOMATISIERUNGSSYSTEME GMBH, Bönnigheim (DE)

(72) Inventors: Jakob Szekeresch, Schömberg (DE); Michael Hammann, Oberderdingen (DE); Torsten Vegelahn, Sternenfels (DE); Werner Kreibl, Überlingen (DE)

(73) Assignee: EKRA AUTOMATISIERUNGSSYSTEME GMBH, Bönnigheim (DE)

( * ) Notice: Subject to any disclaimer, the term of this patent is extended or adjusted under 35 U.S.C. 154(b) by 0 days.

(21) Appl. No.: 18/002,580

(22) PCT Filed: Jun. 29, 2021

(86) PCT No.: PCT/EP2021/067812
§ 371 (c)(1),
(2) Date: Dec. 20, 2022

(87) PCT Pub. No.: WO2022/002915
PCT Pub. Date: Jan. 6, 2022

(65) Prior Publication Data
US 2023/0234348 A1    Jul. 27, 2023

(30) Foreign Application Priority Data
Jun. 30, 2020 (DE) ............... 10 2020 208 163.8

(51) Int. Cl.
*B41F 15/08*    (2006.01)
*B41F 15/36*    (2006.01)
(Continued)

(52) U.S. Cl.
CPC ...... *B41F 15/0845* (2013.01); *B41F 15/0881* (2013.01); *B41F 15/36* (2013.01);
(Continued)

(58) Field of Classification Search
None
See application file for complete search history.

(56) References Cited

U.S. PATENT DOCUMENTS 2,458,773 A    1/1949    Foard
2,610,577 A    9/1952    Heintges
(Continued)

FOREIGN PATENT DOCUMENTS

AT    656177 A    12/1982
CH    316383 A    10/1956
(Continued)

OTHER PUBLICATIONS

International Search Report for corresponding International Application No. PCT/EP2021/067812 mailed Oct. 25, 2021.
(Continued)

*Primary Examiner* — Leslie J Evanisko
(74) *Attorney, Agent, or Firm* — Pearne & Gordon LLP

(57) ABSTRACT

A printing machine for printing on planar substrates, in particular circuit boards. The printing machine includes a printing table which extends in a horizontal plane and on which at least one substrate to be printed on can be arranged and at least one printing device assigned to the printing table. The printing device has a screen holder for an interchangeable printing screen and a doctor device assigned to the screen holder, wherein, by means of the doctor device, a printing material can be applied onto the substrate to be printed on through the printing screen. A screen magazine is assigned to the doctor device for storing at least one printing screen for the doctor device.

16 Claims, 3 Drawing Sheets

(51) Int. Cl.
 *B41F 15/44* (2006.01)
 *H05K 3/12* (2006.01)
(52) U.S. Cl.
 CPC .......... *B41F 15/44* (2013.01); *H05K 3/1225* (2013.01); *B41P 2215/50* (2013.01)

(56) References Cited

U.S. PATENT DOCUMENTS

| | | | |
|---|---|---|---|
| 4,173,928 A | | 11/1979 | Mitter |
| 4,195,567 A | | 4/1980 | Mitter |
| 4,669,377 A | * | 6/1987 | Ericsson ................ B41F 15/36 101/114 |
| 4,907,505 A | * | 3/1990 | Ericsson ................ B41F 15/36 101/DIG. 36 |
| 11,141,970 B2 | * | 10/2021 | Fujimoto ............ B41F 15/0881 |
| 2021/0178681 A1 | | 6/2021 | Vasic et al. |

FOREIGN PATENT DOCUMENTS

| | | | |
|---|---|---|---|
| DE | 2643226 A1 | 3/1978 | |
| DE | 3928527 A1 | 3/1991 | |
| DE | 10 2017 216 862 B3 | 11/2018 | |
| EP | 3 482 934 A1 | 5/2019 | |
| GB | 1 586 282 | 3/1981 | |
| JP | H04-197684 A | 7/1992 | |
| JP | H07-314639 A | 12/1995 | |
| WO | 2016/095060 A1 | 6/2016 | |
| WO | WO-2018105016 A1 * | 6/2018 | .......... B41F 15/0881 |
| WO | 2019/244265 A1 | 12/2019 | |

OTHER PUBLICATIONS

Written Opinion for corresponding International Application No. PCT/EP2021/067812 dated Oct. 25, 2021.

* cited by examiner

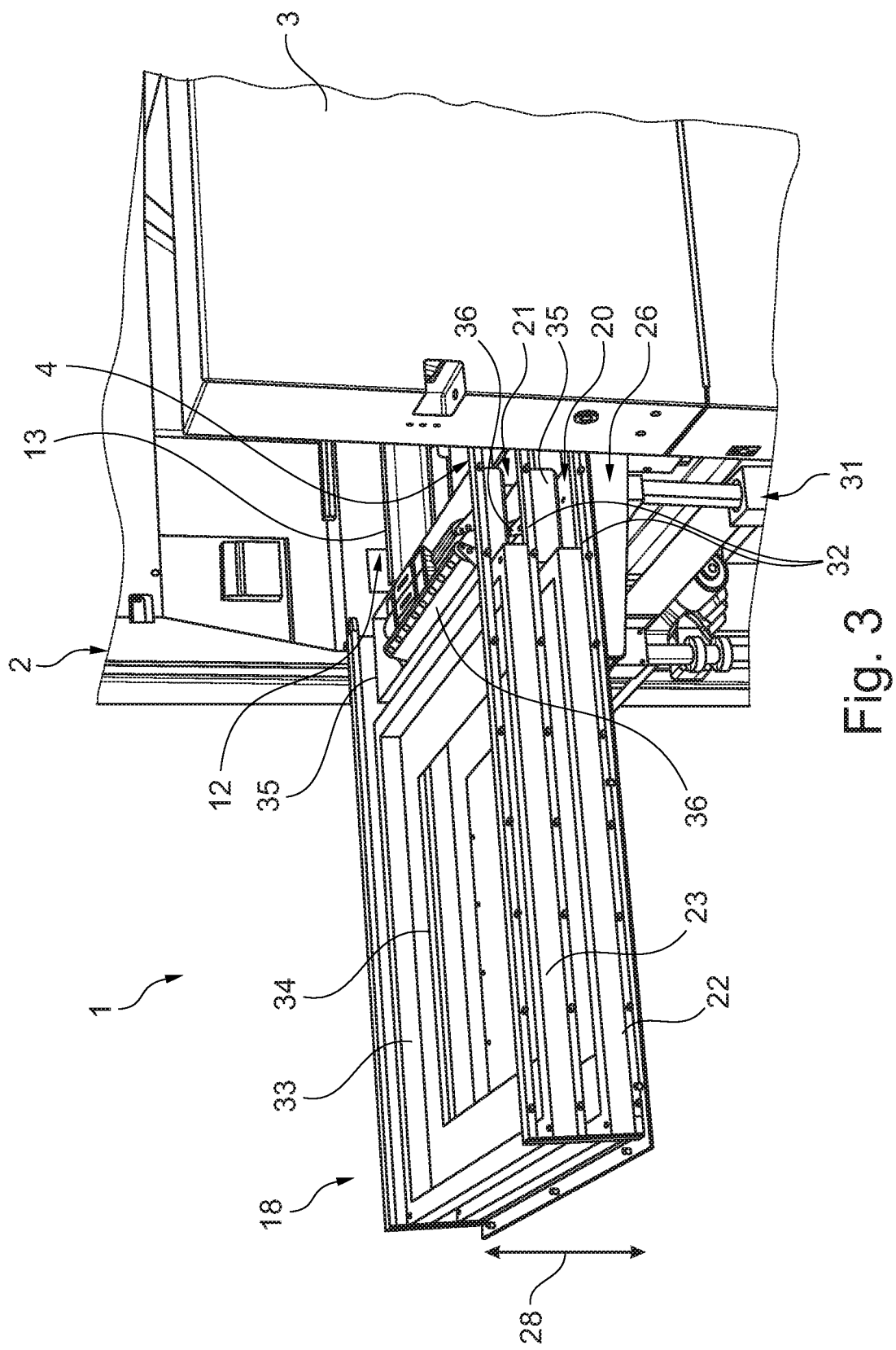

PRINTING MACHINE AND PRINTING SYSTEM HAVING SCREEN MAGAZINE FOR PRINTING ON PLANAR SUBSTRATES

FIELD OF THE INVENTION

The invention relates to a printing machine for printing on planar substrates, in particular circuit boards, comprising: a printing table which extends in a horizontal plane and on which at least one substrate to be printed on can be arranged; at least one printing device assigned to the printing table, which printing device has a screen holder for an interchangeable printing screen and a doctor device assigned to the screen holder, by means of which doctor device a printing material can be applied onto the substrate to be printed on through a printing screen; and a screen magazine assigned to the doctor device for storing at least one printing screen for the printing device.

Further, the invention relates to a printing system having a printing machine designed as described above.

BACKGROUND OF THE INVENTION

Printing machines and printing systems of the type mentioned at the beginning are known in the prior art. For printing on planar substrates with a printing material, in particular a printing paste, which is electrically conductive, for example, it is known to apply the printing material onto the substrate to be printed on by means of a doctor device and a printing screen. To this end, known printing machines have a printing table on which the substrate to be printed on can be arranged and can in particular be locked, as well as the doctor device already mentioned and the printing screen arranged between the doctor device and the substrate. First, the printing material is applied onto the printing screen on the side of the printing screen facing away from the substrate, and then pressed or squeezed through the printing screen onto the underlying substrate by means of the doctor device. Because only one print pattern can be applied onto the substrate with each printing screen, a separate printing screen must be produced and kept ready for each desired print image. In particular with substrates to be printed on with different printing materials along different structures, even when printing on individual substrates, the exchange of a printing screen is necessary if it is not desired to provide a separate printing machine for each printing process. Therefore, screen magazines have already been developed in the past which are used for storing multiple printing screens and assigned to the doctor device for exchanging printing screens. Today, for example, changing devices are known which perform an exchange of a printing screen of the printing machine with a printing screen kept in a screen magazine in a fully automated manner. As such, known screen magazines are arranged independently next to the printing machine and are designed to hold a plurality of printing screens. Printing machines having such screen magazines require a lot of installation space which is rarely available, especially in production lines.

BRIEF SUMMARY OF THE INVENTION

Therefore, an object of the invention is to provide an improved printing machine, requiring little installation space despite the presence of a screen magazine and enabling an advantageous exchange of printing screens.

The disclosed a printing machine has the advantage that the screen magazine only needs a lot of installation space when a screen exchange takes place and is otherwise arranged on the printing machine in a manner saving installation space. This makes it possible, for example, for the printing machine to be arranged in a production line such that the screen magazine is arranged in a path for people or operators leading past the printing machine for performing an exchange process and otherwise clears the path. This ensures an advantageous utilization of the available installation space, for example in a production hall or the like. According to the invention, this is achieved by the screen magazine having a housing with at least two drawers which are arranged in parallel to one another and are each designed to hold one printing screen, wherein the housing is pivotably arranged relative to the doctor device such that it can pivot between a first position, in which the drawers are oriented in parallel to the horizontal plane, and a second end position, in which the drawers are oriented at an angle, in particular at a right angle, to the horizontal plane. Thus, the screen magazine is pivotably mounted between a horizontal orientation and one inclined relative thereto. In the horizontal orientation, the housing or the screen magazine extends far into the space next to the printing machine, whereas it substantially rests against the printing machine in the vertical orientation, thus only requiring little installation space next to the printing machine. Thus, the pivotability of the screen magazine achieves only temporary use of installation space, which results in the printing machine being able to also be arranged in locations where a sufficiently wide passage must be present at the machine at least temporarily to allow personnel or vehicles driving autonomously, for example, to pass. In order to ensure that the installation space is cleared in an advantageous manner if an exchange of a screen does not take place, the housing preferably has a height which is significantly smaller than the length of the housing. As such, the length of the housing is understood to mean the (horizontal) longitudinal extension of the housing in the first end position, and accordingly, the height of the housing is understood to mean the (vertical) height of the housing in the first end position. Preferably, for this purpose, the screen magazine has a limited number of drawers, such as, for example, a maximum of four or less, preferably only two. In particular, the screen magazine is integrated or able to be integrated into the printing machine in a permanent/fixed or interchangeable/releasable manner.

According to a preferred development of the invention, the housing is oriented at least substantially vertically to the drawers in the second end position. This results in a particularly low use of installation space at the moment where an exchange of a printing screen is not carried out or at the time when a printing process is performed by the printing machine by means of a printing screen. For this purpose, the housing is pivoted, in particular by 90°, from the horizontal into the vertical end position or the other way around.

According to a preferred development of the invention, the housing is mounted to be height-adjustable relative to the screen holder at least in the first end position. By adjusting the height of the housing it is achieved that the printing screens arranged in the housing and retained in the drawers are movable in height. In this way it is achieved, for example, that the printing screen to be used for a print is always arranged at the height of the screen holder thanks to a height adjustment of the housing. As a result, the respective screen can always be extended from the housing at the same height with respect to the screen holder, thereby requiring simple mechanics or kinematics for performing the actual exchange process. According to a further embodiment of the invention, the housing is pivotable by up to 180°, so that it reaches the second end position in a stowed position underneath the printing table, thereby ensuring maximum installation space to be saved next to the printing machine. According to a further embodiment of the invention, the drawers are additionally or alternatively height-adjustable in the housing, so that they can be displaced in height within the housing, without the printing screen to be inserted or pushed out always being at the desired height with respect to the doctor device or the screen holder.

Furthermore, it is preferably provided that the printing machine has a device designed to insert a printing screen into one of the drawers and pull it from one of the drawers and into the screen holder. Hence, the device is used to exchange printing screens. Thus, the exchange process is performed, in particular fully automatically, by the printing machine itself.

Particularly preferably, the device is designed as a magnetically operated gripping device. As such, the printing screens are preferably magnetizable or magnetized themselves to cooperate with the gripping device. Thanks to the magnetic design, a positive-fit connection of the device and the printing screen is not necessary, so that the printing screen itself is able to be implemented at low cost and saving installation space.

Particularly preferably, the device is designed separately from the doctor device. This means that the device has its own actuators for moving the respective printing screen from the screen magazine to the doctor device and back.

According to an alternative embodiment of the invention, the device is formed by the doctor device itself. This means that the doctor device is also suitable for inserting one of the printing screens into the screen magazine and pulling another printing screen from the screen magazine and placing it in the screen holder, for example. Typically, the doctor device has a carrier or carriage which extends transversally across the printing table and which is guided on rails on the edges and is movable using a drive. This enables simple positioning of the doctor device or a doctor blade of the doctor device. Thus, it is provided, for example, that a doctor blade holder for holding a doctor blade is movable by the doctor device above the printing table and is used as a gripping device for displacing a printing screen. For this purpose, the doctor blade holder is designed to be magnetizable, for example, to displace one of the printing screens if needed. Particularly preferably, in this case, the doctor blade holder is also movable in height, in particular to grip or release a printing screen.

According to a further embodiment of the invention, the device is preferably formed integrally with a camera device movable across the printing table. Known printing machines have a camera device which is used, for example, to check for the correct orientation and/or position of a substrate on the printing table or of a printing screen to be employed on the doctor device. For this purpose, a camera is traversed across the printing table, by means of which the substrate and/or the printing screen is/are captured visually. Then, image analysis is used to establish whether the printing screen and substrate are optimally oriented relative to one another. If deviations are detected, the printing screen or the substrate is displaced on the printing table, for example, until the desired positioning is achieved. As such camera devices comprise a camera movable in an X-Y plane, the actuators already present for moving the camera can be used to grip a printing screen and insert it into and pull it out of the housing. For this purpose, the camera device optionally has a mechanical gripper or plunger, or a magnetic or magnetizable gripper, by which the respective printing screen is grippable and displaceable.

Particularly preferably, the printing table, the doctor device and the screen magazine are arranged or retained on a frame. The frame ensures an advantageous arrangement of the printing table, doctor device and screen magazine relative to each other.

Furthermore, it is preferably provided that the housing is pivotably mounted on the frame. In this way, the housing is simply assigned and mechanically connected to the doctor device. This ensures a robust arrangement of the screen magazine on the printing machine.

Preferably, the housing of the screen magazine is mounted on the frame such that it is displaceable in height, so that the above-mentioned advantages of height adjustment are achieved.

Particularly preferably, the housing is mounted on the printing table by a linearly displaceable pivot joint. The pivot joint enables pivoting the housing and the linear displaceability enables the height adjustment.

Preferably, at least one controllable actuator for shifting the housing, in particular for pivoting and/or displacing the housing or the screen magazine, is assigned to the housing. In this way, automated adjustment of the housing into the first or second end position and height adjustment are able to be performed in an automated manner.

Particularly preferably, the actuator is designed as an electric, hydraulic, or pneumatic actuator. Furthermore, it is preferably provided that a releasable retaining device is assigned to the housing, which is designed to lock the housing in the first end position in a positive fit. This saves energy for retaining the housing in the first end position since, for example, the actuator does not have to retain the housing in the first end position against gravity permanently. Rather, the releasable retaining device ensures positive-fit locking, for example a latch engagement, in particular on the frame.

Preferably, the housing is designed to hold differently sized printing screens. For this purpose, for example, the drawers are designed differently or designed such that differently sized printing screens can be placed in the drawers.

Particularly preferably, the respective drawer is designed to hold the respective printing screen and a doctor tool for the doctor device. Thus, it is achieved that a printing screen can be arranged together with the doctor tool, in particular the doctor blade, in the housing. Carrying the doctor blade along with the printing screen has the advantage that a simple conversion of the doctor device to different printing materials or types of printing materials is possible as the doctor blade stays together with the printing screen and is exchanged along with it. In this way, cleaning the doctor blade for performing a further printing process with a then different printing material can be omitted. This further reduces the conversion time of the printing machine. In particular, the respective printing screen has a holder for at least one doctor blade, so that the doctor blade is able to be carried along with the respective printing screen.

Particularly preferably, the screen magazine is releasably or interchangeably arranged on the frame or the doctor device. In this way, an exchange of the entire screen magazine or screen magazine is also easy to perform, for example. Thus, the screen magazine can be equipped and prepared away from the printing machine and then added to the printing machine, for example, locked on the frame and connected or coupled to the at least one actuator. Particularly preferably, the screen magazine is designed to be released or removed from the rest of the printing machine by a robot, in particular a material handling tool, and moved to a pick-and-place machine, for example for being mounted with printing screens or for exchange of the printing screens mounted in the screen magazine. According to an alternative embodiment of the invention, the screen magazine is preferably arranged on the frame or the doctor device in a permanent or fixed manner, so that a particularly robust connection to the frame or the doctor device can be implemented.

According to a preferred development of the invention, the screen magazine has a means for pushing out and/or retracting printing screens out of and/or into one of the drawers. As an example, the means is a pusher arranged on the end of the housing facing away from the doctor device to push at least part of a printing screen out of the housing as needed, so that it can be gripped by the device for displacing or for exchanging the printing screens more easily.

Furthermore, the invention relates to a printing system for printing on planar surfaces, having a printing machine designed as described above.

The printing system according to the invention is characterized by having at least one printing screen designed to be held in one of the drawers of the screen magazine. For this purpose, the printing screen has an outer contour, for example, corresponding to the dimensions of the respective drawer.

Particularly preferably, the printing screen is designed to hold at least one doctor tool, in particular a doctor blade, and the respective drawer of the screen magazine is designed to hold the printing screen together with the at least one doctor tool. This results in the advantages already mentioned above.

BRIEF DESCRIPTION OF THE DRAWINGS

The invention will be explained in more detail below with reference to the drawings. Therein, FIG. 3 shows a detailed perspective view of the printing machine.

DESCRIPTION OF EXAMPLE EMBODIMENTS

Figure 1:
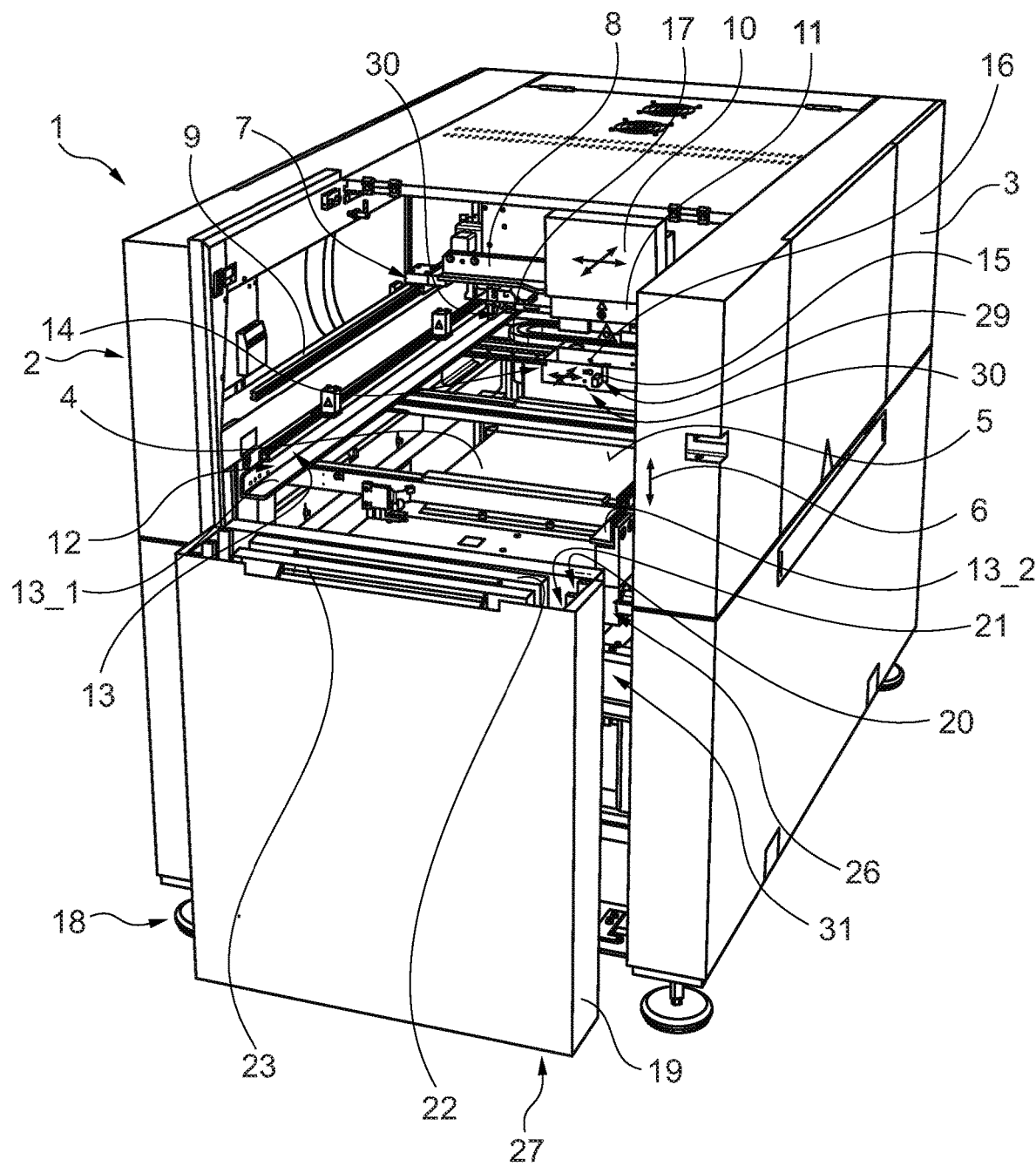
FIG. 1 shows a perspective representation of an advantageous printing machine.

FIG. 1 shows a perspective representation of an advantageous printing machine 1 designed to print on planar substrates with a, in particular electrically conductive, printing material or paste to produce circuit boards, for example. As such, printing machine 1 has a frame 2, carrying a housing 3 which protects the components of printing machine 1 located on the inside of housing 3 from external influences. In housing 3, a printing table 4 is arranged, having a support surface 5 extending horizontally for supporting one or more substrates to be printed on. Preferably, printing table 4 is movable in height, as shown by a double arrow 6, to ensure an optimum height position of a substrate to be printed on. Above printing table 4, i.e., opposite support surface 5, printing machine 1 also has a doctor device 7. Doctor device 7 has a first carriage 8 displaceable across printing table 4 along a rail guide 9 extending horizontally, and a second carriage 10 mounted on first carriage 8 so as to be displaceable transversely to the pushing direction of rail guide 9. A doctor blade mount 11 is arranged on second carriage 10 and designed to hold and actuate a doctor tool, in particular a doctor blade 36.

A screen holder 12 is arranged vertically between printing table 4 and carriage 9, 8. Advantageously, screen holder 12 has a drawer-type rail guide 13, extending in parallel to rail guide 9 and having, just like rail guide 9, guide rails 13_1, 13_2, e.g., screen or stencil support strips, arranged on either side of printing table 4 in parallel to one another. Rail guide 13 is designed to guide or carry a printing screen on the edges, so that a printing material is able to be applied to the printing screen and is printable on a substrate supported on printing table 4 through the printing screen by means of a doctor blade arranged on doctor blade mount 11.

Furthermore, printing machine 1 has a camera device 14, having a camera 15 which is arranged to be movable vertically between doctor device 7 and printing table 4. For this purpose, camera 15, just like doctor blade mount 11, is retained on a carriage 16 mounted on a carriage 17 to be displaceable longitudinally, wherein carriage 17 is displaceable longitudinally in parallel to rail guide 9 of doctor device 7 above printing table 4 and displaceable below doctor device 7. This allows to move camera 15 across the entire printing table 4. Preferably, in this case, camera 15 is arranged or designed such that it is assigned to printing table 4 and/or doctor device 7, in particular screen holder 12, to check the position of a substrate supported on printing table 4 and/or the position of a printing screen held in rail guide 13 or screen holder 12 before a printing process is carried out. For example, if a deviation of a current actual position of a printing substrate or printing screen from a target position is detected, then either an automated adjustment is performed or the operator of printing machine 1 is advised to align the substrate and/or the screen correctly.

Furthermore, printing machine 1 has an advantageous screen magazine 18 operable to simplify, in particular automate, conversion of printing machine 1 for the printing process with another printing screen than the one used before.

According to the present exemplary embodiment, screen magazine 18 has two drawers 20, 21 arranged in parallel to one another in a housing 19. Each drawer 20, 21 is operable to hold at least one printing screen, wherein a printing screen 22 is arranged in drawer 20 and a printing screen 23 is arranged in drawer 21 according to the present exemplary embodiment. Preferably, the printing screens have different printing structures.

Figure 2A:
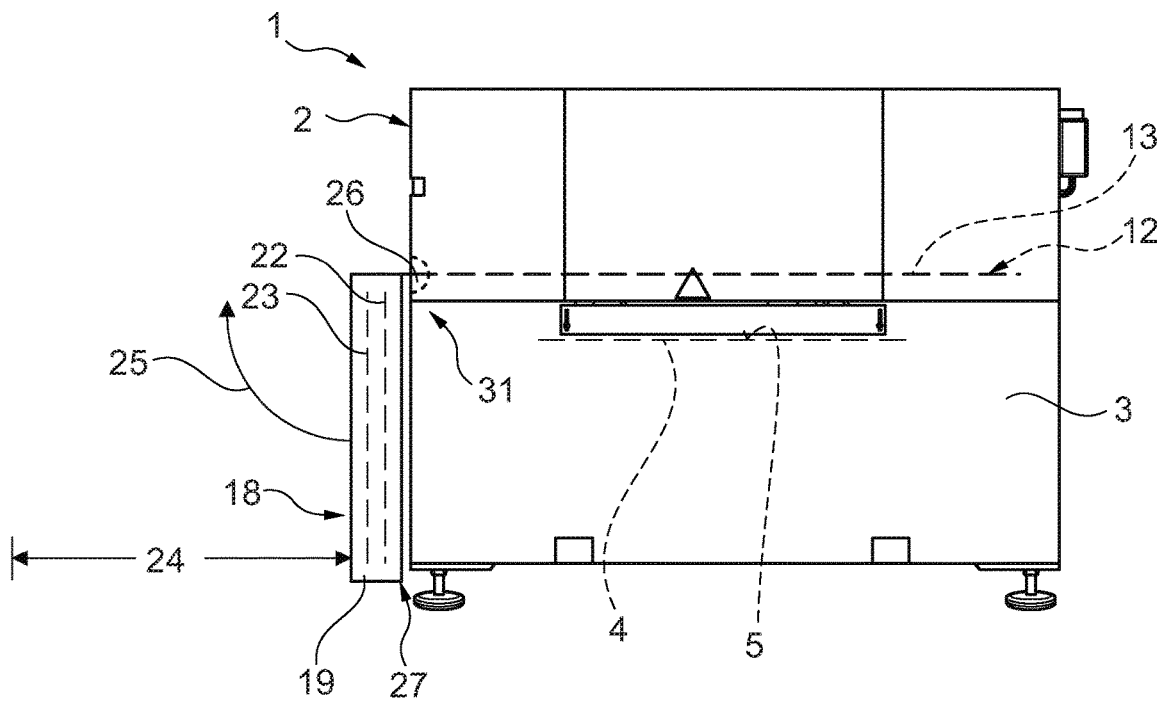
FIGS. 2A and 2B show the printing machine in different operating states, each in a side view.

FIG. 2A shows a side view of printing machine 1 in the state also shown in FIG. 1. Here, screen magazine 18 is oriented vertically, so that printing screens 22, 23 located therein are arranged standing vertically next to each other, as indicated by dashed lines in FIG. 2A, and thus at an angle of almost or exactly 90° to the plane along which support surface 5 of printing table 4 or screen holder 12 extends, as also indicated by a dashed line in FIG. 2A.

Due to housing 19 being designed with only two drawers 20, 21 to hold two printing screens 22, 23, housing 19 only slightly protrudes laterally from housing 3 of printing machine 1 in the vertical end position. As such, the space next to printing machine 1 in the region of screen magazine 18 can be used for something else. As an example, the space next to printing machine 1 is a corridor or path 24 adjacent a production line in the production hall.

Figure 2B:
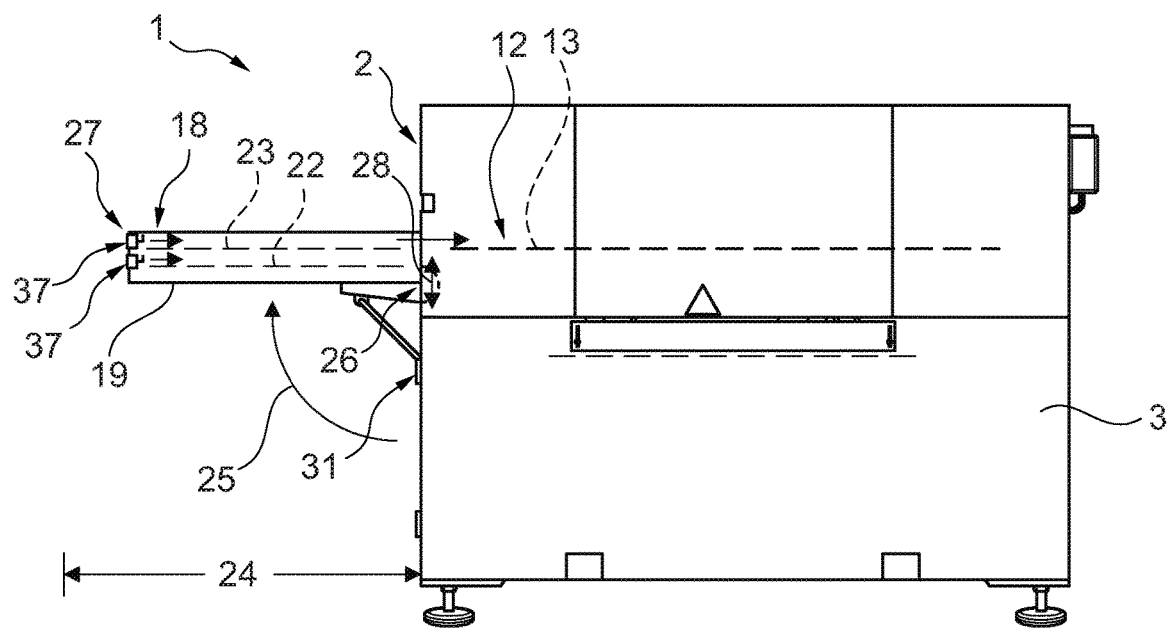

Screen magazine 18 is mounted pivotably particularly on frame 2, so that it is pivotable from the vertical end position shown in FIG. 2A into the horizontally oriented end position shown in FIG. 2B, as indicated by an arrow 25. For this purpose, screen magazine 18 is secured on frame 2 by a swivel or pivot joint 26. As such, pivot joint 26 or the axis of rotation formed by pivot joint 26 is conveniently arranged on the upper end of housing 19 or screen magazine 18 in the vertical orientation. In this way, free end 27 of screen magazine 18, located at the bottom in FIG. 2A, is pivotable around the axis of rotation of pivot joint 26, at least until screen magazine 18 reaches the horizontal orientation, as shown in FIG. 2B. In this state, printing screens 22, 23 located in drawers 20, 21 are then located parallel to one another and are oriented horizontally on top of each other, wherein printing screen 23 is located above printing screen 22 according to the present exemplary embodiment. In the horizontal end position, as shown in FIG. 2B, at least one of drawers 20, 21 is located at the height of rail guide 13, so that by simply displacing the printing screen located in this drawer, it is shiftable into the printing position from housing 19 of screen magazine 18 on rail guide 13 of screen holder 12. In FIG. 2B, a respective example of rail guide 13 is shown by a dashed line. In order for second drawer 20 also being able to be assigned to rail guide 13, pivot joint 26 is preferably mounted on frame 2 to be displaceable in height, as shown by a double arrow 28 in FIG. 2B. With this displacement in height, the one or the other drawer 20, 21 can be assigned to rail guide 13 and hence the one or the other printing screen is able to be pushed out of housing 19 or inserted into housing 19. Alternatively or additionally, screen holder 12 or rail guide 13 is shiftable or displaceable in height by means of a controllable actuator according to double arrow 28 to move screen holder 12 and desired drawer 20 or 21 in a common plane.

According to an advantageous exemplary embodiment of printing machine 1, a gripping device 29 is arranged on carriage 16 of camera device 14, as shown in FIG. 1, by which printing screens 22, 23 are displaceable. As a result, camera device 14 also forms a device 30 which inserts a printing screen into one of drawers 20, 21 and pulls it out of one of drawers 20, 21 and into screen holder 12 as needed. In this case, gripping device 29 is designed as a transport pin, for example, to mechanically engage behind and displace a printing screen, or as a magnetic gripper generating a magnetic field, in particular by electrification, cooperating with respective printing screen 22, 23 to displace the same. For this purpose, printing screens 22, 23 are correspondingly made from a material or have a material in at least parts thereof, which cooperates with the magnetic gripper.

As an example, a conversion process of printing machine 1 takes place as follows. A printing screen, e.g., printing screen 23, is already located on guide rails 13_1, 13_2 of screen holder 12, and a printing process has already been carried out by means of printing screen 22. Now, another printing process is to be accomplished, requiring another print pattern, so that an exchange of printing screen 22 with printing screen 23 is necessary. First, existing printing screen 22 is inserted into the free drawer, e.g., drawer 21, by camera device 14 or gripping device 30 along rail guide 13. For this purpose, screen magazine 18 is shifted from the vertical end position into the horizontal end position in advance, as shown in FIG. 2B, and adjusted in height as needed, so that drawer 20 is located at the height of rail guide 13. This ensures easy insertion of printing screen 22 into screen magazine 18. Then, screen magazine 18 is adjusted in height, so that the other drawer with printing screen 23 located therein is at the height of rail guide 13. Now, gripping device 30 grips printing screen 23 assigned to rail guide 13, e.g., magnetically, and pulls it out of drawer 21 onto the rail guide and up to the desired position above printing table 4, so that a printing process is able to be performed by means of printing screen 23. In this way, the conversion is particularly performed in a fully automated manner and in a short time. During the printing process or multiple printing processes in which the same printing screen 23 is employed, housing 19 is conveniently adjusted to the vertical end position, as shown in FIG. 2A, so that the passage along path 24 is cleared. Housing 19 of screen magazine 18 protrudes into and may block path 24 only in the horizontally oriented end position. Screen magazine 18 thus serves as a changing device or conversion device for printing machine 1.

In the vertical end position, as shown in FIG. 2A and also in FIG. 1, screen magazine 18 can be equipped with printing screens by an operator or in an automated manner. As a result, a conversion process of printing machine 1 can be prepared while a printing process is being carried out and without screen magazine 18 taking up a lot of installation space next to printing machine 1, in particular in the region of path 24.

For shifting and pivoting screen magazine 18, at least one actuator 31 is preferably present, which is designed as an electromotively, pneumatically or hydraulically operated actuator 31, for example, and pivots and/or adjusts screen magazine 18 in height. To achieve the latter, for example, pivot joint 26 is displaceably mounted on a rail guide on frame 2 and displaceable by actuator 31 or another actuator.

Optionally, screen magazine 18 is releasably or interchangeably retained particularly on frame 2, so that it can be removed from printing machine 1 by an operator or a robot, in particular a material handling tool, and moved to another location, for example for equipment with further or other printing screens as needed. Alternatively, screen magazine 18 is particularly secured on the frame in a permanent or fixed manner.

FIG. 3 shows a further perspective representation of an enlarged detailed view of printing machine 1 in the region of screen magazine 18, in which housing 19 of screen magazine 18 is removed to show the internal structure of screen magazine 18. As an example, drawers 20, 21 are formed by guide rails 32 arranged laterally or by plate-like supports. As such, drawers 20, 21 are designed sufficiently high to hold one printing screen 22, 23 each. In the exemplary embodiment shown in FIG. 1 and FIG. 3, printing screens 22, 23 are arranged in drawers 20, 21. In contrast to FIG. 1, FIG. 3 shows screen magazine 18 in the horizontal end position.

Each of the respective printing screens 22, 23 has a screen frame 33 on which a screen 34 is retained, in particular clamped. The screen may be a printing stencil or a printing mask. In addition, a retaining device 35 for holding a doctor tool, in particular a doctor blade 36, is arranged on respective frame 33. As such, retaining device 35 is firmly connected to frame 33, so that a doctor blade 36 is able to be carried along with the respective printing screen 22, 23.

This improves the conversion of printing machine 1 in that not only a printing screen, but also a doctor blade to be used with the printing screen can be exchanged or converted in an automated manner. It is thereby achieved, for example, that printing screens 22, 23 can be loaded with different printing materials and processed with different doctor blades without requiring a doctor blade to be exchanged or in particular cleaned during conversion of printing machine 1.

According to a further exemplary embodiment, gripping device 30 is not formed by camera device 14 but by doctor device 7. For this purpose, carriage 10 has gripper 15, for example. Alternatively, doctor blade mount 11 is designed to grip doctor blade 36 automatically. As soon as it grips doctor blade 36 of a printing screen 23 arranged in screen magazine 18, it can move printing screen 23 as a whole by moving doctor blade 36. As a result, printing screens 22, 23 in printing machine 1 are converted by doctor device 7 without requiring additional gripping devices or the like.

Optionally, screen magazine 18 has a means 37, in particular a pusher, assigned to respective drawer 20, 21, as shown in FIG. 2B as an example, by which at least a part of printing screen 22, 23 respectively located in drawer 20, 21 can be pushed out of housing 18 in the direction of screen holder 12, so that gripping respective printing screen 22, 23 by device 30, in particular by doctor device 7, is simplified.

Together with printing screens 22, 23 and in particular with further printing screens not shown herein, having different print patterns, for example, and in particular designed to be held in drawers 20, 21 and in screen holder 12, printing machine 1 forms an advantageous printing system.

The invention claimed is:

1. A printing machine for printing on planar substrates, comprising: a printing table which extends in a horizontal plane and on which at least one substrate to be printed on can be arranged; at least one printing device assigned to the printing table, which printing device has a screen holder for an interchangeable printing screen and a doctor device assigned to the screen holder, wherein, by means of the doctor device, a printing material can be applied onto the substrate to be printed on through the printing screen; and a screen magazine assigned to the doctor device for storing at least one printing screen for the doctor device, wherein the screen magazine has a housing with at least two drawers which are arranged in parallel to one another and are each designed to hold one printing screen, wherein the housing is pivotably arranged such that the housing can pivot between a first end position, in which the drawers are oriented parallel to the horizontal plane, a second end position, in which the drawers are oriented at an angle to the horizontal plane, and further comprising a device designed to insert a printing screen into one of the drawers and pull the printing screen out of the drawers, wherein the device is formed by a camera device movable across the printing table.

2. The printing machine according to claim 1, wherein the housing is oriented at least substantially perpendicular to the printing table in the second end position.

3. The printing machine according to claim 1, wherein the housing is mounted to be height-adjustable at least in the first end position.

4. The printing machine according to claim 1, wherein the device has a magnetically operated gripping device.

5. The printing machine according to claim 1, wherein the device is designed separately from the doctor device.

6. The printing machine according to claim 1, comprising a frame on which the printing table, the doctor device and the screen magazine are arranged.

7. The printing machine according to claim 6, wherein the housing is mounted on the frame such that the housing is displaceable in height.

8. The printing machine according to claim 6, wherein the housing is mounted on the frame by a linearly displaceable pivot joint.

9. The printing machine according to claim 6, wherein the screen magazine is retained interchangeably on the frame.

10. The printing machine according to claim 1, wherein at least one controllable actuator for shifting and/or pivoting the screen magazine is assigned to the housing.

11. The printing machine according to claim 10, wherein the actuator is designed as an electric, hydraulic, or pneumatic actuator.

12. The printing machine according to claim 1, wherein the screen magazine is designed to hold differently sized printing screens.

13. The printing device according to claim 1, wherein the respective drawer is designed to hold the respective printing screens and a doctor tool, comprising a doctor blade, assigned to the respective printing screen.

14. The printing machine according to claim 1, wherein the screen magazine has a means for pushing out and retracting printing screens out of and/or into one of the drawers.

15. A printing system for printing on planar surfaces, comprising: a printing machine according to claim 1; and at least one printing screen designed to be held in one of the drawers of the screen magazine.

16. The printing system according to claim 15, wherein the printing screen is designed to hold a doctor tool, comprising a doctor blade, and in that the respective drawer is designed to hold the printing screen together with the doctor tool.

* * * * *